(12) United States Patent
Liao et al.

(10) Patent No.: US 6,664,464 B2
(45) Date of Patent: Dec. 16, 2003

(54) EMI SHIELDING DEVICE

(75) Inventors: Hung-Ta Liao, Taipei (TW); Ming-Chu Hou, Taipei (TW); Wei-Jen Lee, Hsi Chin (TW); Guo-Ming Huang, Taipei (TW)

(73) Assignee: Quanta Computer Inc., Taoyuan Hsien (TW)

( * ) Notice: Subject to any disclaimer, the term of this patent is extended or adjusted under 35 U.S.C. 154(b) by 0 days.

(21) Appl. No.: 10/178,236

(22) Filed: Jun. 25, 2002

(65) Prior Publication Data
US 2003/0029626 A1 Feb. 13, 2003

(30) Foreign Application Priority Data
Aug. 9, 2001 (TW) ...................................... 90213605 U

(51) Int. Cl.[7] .................................................. H05K 9/00
(52) U.S. Cl. ............................. 174/35 GC; 174/35 R; 361/816; 361/818
(58) Field of Search ........................ 174/35 GC, 35 R; 361/816, 818, 667

(56) References Cited

U.S. PATENT DOCUMENTS

| | | | | |
|---|---|---|---|---|
| 6,349,043 B1 | * | 2/2002 | Jensen et al. | 361/818 |
| 6,388,893 B1 | * | 5/2002 | Calderon | 361/818 |
| 6,390,320 B2 | * | 5/2002 | Hurst et al. | 220/241 |
| 6,483,023 B1 | * | 11/2002 | Jacques | 174/35 GC |

* cited by examiner

*Primary Examiner*—Dean A. Reichard
*Assistant Examiner*—W. David Walkenhorst

(57) ABSTRACT

This specification discloses an anti-EMI device used in electronic products. The device contains a U-shape component and a spring component. The U-shape component is embedded inside the housing of an electronic product for fixing and connecting the anti-EMI device to the electronic product. The spring component is used to shield the EMI from the electronic product. The spring component is connected to the bottom surface of the U-shape component, extending along both sidewalls toward the opening of the U-shape component and protruding out of the electronic product housing.

14 Claims, 3 Drawing Sheets

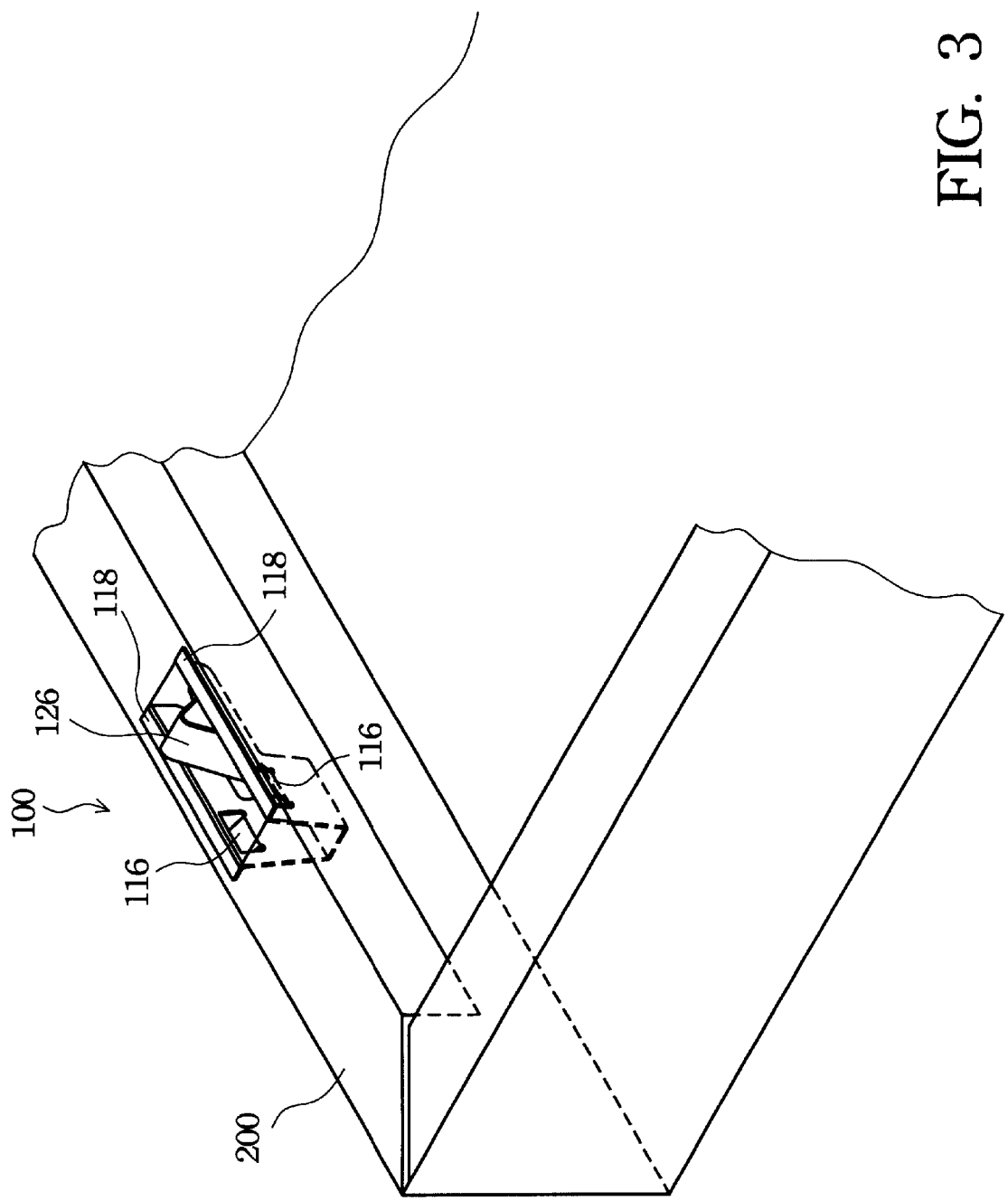

EMI SHIELDING DEVICE

BACKGROUND OF THE INVENTION

1. Field of Invention

The invention relates to an EMI (electromagnetic interference) shielding device and, in particular, to an anti-EMI device that can shield EM (electromagnetic) waves.

2. Related Art

In observation of recent development in the electric information industry, particularly the wide uses of various electric information products, unnecessary voltages or currents exist among various internal systems of the compact electronic information product and produce many wide-frequency noises. Such noises seriously affect the functions of different parts. This phenomenon is normally called the EMI (electromagnetic interference). The EMI is a complicated problem in the computer manufacturing industry. The interference sources include the CPU (central processing unit), motors, inverters, relays, switches, transistors, amplifiers, power supplies or other exchange circuits.

To ensure operations of electronic products in normal EM environments, countries all over the world have started to implement EM controls, gauging the standards of many electronic, communication, scientific, industrial and medical instruments. Export or local products have to pass tests in certified EM compatibility laboratories before they can be sold on the market.

In general, the occurrence of EMI in electric information products may result from bad internal circuit designs or shielding. To solve the problems caused by the EMI in the prior art, one can either improve the circuit or use an EM wave shielding material to absorb or block EM waves. Such EM wave shielding materials include conductive shielding gaskets and metal foils. Currently, the conductive gasket used in the electronic products such as PC's (personal computer), servers and mobiles has a long stripe structure. This structure is formed by wrapping a gasket with a conductive cloth. In addition to providing perfect EM wave shielding effects, the conductive gasket can even be made into different shapes to fit the configuration of all sorts of electric information products.

However, the conductive gasket still has several drawbacks in practice. For example, separate parts of an electric information device (e.g. upper and lower shells) often cannot be tightly connected, leaving a gap where EMI shielding is the weak. One is usually forced to attach conductive gaskets on the outer side of the sealing place. Since such conductive gaskets will be destroyed once the upper and lower shells are opened. One then has to attach new conductive gaskets, which may not fit very well. In view of the foregoing, it is highly desirable to provide an anti-EMI device used at the sealing interfaces of electronic devices, blocking leaking EM waves due to imperfect sealing and replacing traditional conductive gaskets to satisfy new safety laws imposed on electronic devices.

SUMMARY OF THE INVENTION

An objective of the invention is to provide an EM wave shielding device used at the sealing interfaces of electronic devices.

Another objective of the invention is to provide an anti-EMI device for electronic products to satisfy the EMI safety laws requirements.

In accordance with the above-mentioned objectives, the invention discloses an anti-EMI device for electronic products. The device includes a U-shape installation component and a spring component. The U-shape installation component is embedded inside the shell of the electronic product to fix and connect the anti-EMI device to the electronic product. The spring component is used to block the EMI of the electronic product. It is connected to the bottom plate of the U-shape component, extending along both sidewalls of the U-shape component toward the opening thereof and protruding from the electronic product shell. A tight elastic seal is formed between the upper and lower shells of the electronic product, effectively shielding the EM waves produced therein to satisfy the EMI safety requirements.

BRIEF DESCRIPTION OF THE DRAWINGS

The present invention will become more fully understood from the detailed description given hereinbelow illustration only, and thus are not limitative of the present invention, and wherein:

FIG. 3 is a schematic view of applying the anti-EMI device to an electronic product.

DETAILED DESCRIPTION OF THE INVENTION

The specification discloses an anti-EMI (electromagnetic interference) device for shielding EM (electromagnetic) waves inside electronic products to satisfy safety law requirements concerning EMI. An embodiment is given below to demonstrate the disclosed anti-EMI device in detail.

Figure 1B:
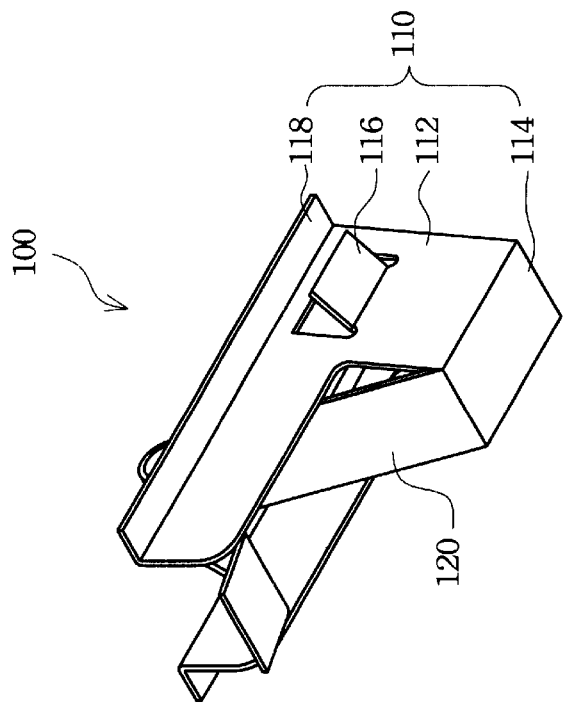
FIG. 1B is a bottom-side view of the disclosed anti-EMI device.
Figure 1A:
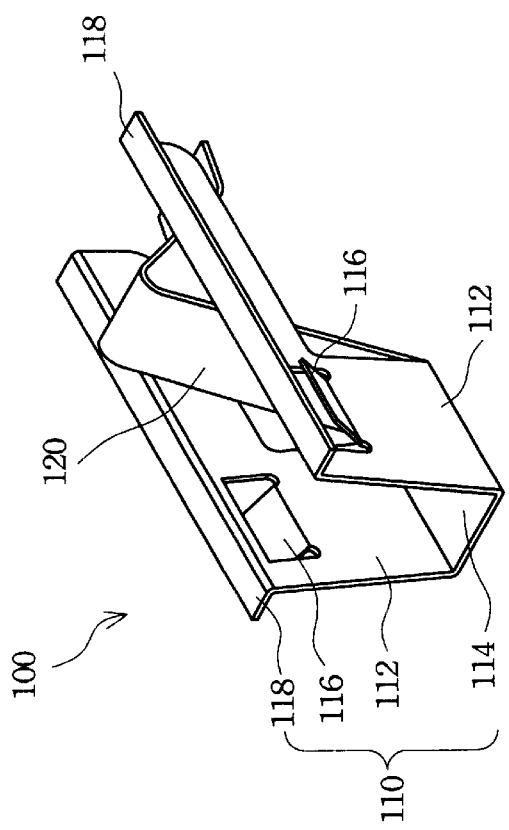
FIG. 1A is a top-side view of the disclosed anti-EMI device.

As shown in FIGS. 1A and 1B, the anti-EMI device 100 mainly contains two parts: a U-shape installation component and a spring component 120. The U-shape installation component 110 and the spring component 120 are both made of metal materials. For example, they can be stainless steel to prevent rust produced on the surface of the anti-EMI device, deteriorating the EMI shielding effect.

The U-shape installation component is used to fix and connect the disclosed anti-EMI device inside an electronic product. The installation component 110 has a U-shape cross section. The U shape is consisted of at least left and right sidewalls 112 and a bottom plate 114 connecting the two sidewalls 112. Additionally, the U-shape installation component 110 can be embedded inside the electronic product and tightly fixed therein utilizing the two sidewalls 112.

On the other hand, the spring component 120 in the anti-EMI device 100 is used to block EM waves produced from the internal components of the electronic product. The spring component 120 is connected to the bottom plate 114. Along the two sidewalls 112 of the U-shape installation component, the spring component 120 extends towards the opening thereof and protrudes from the top edge of the sidewalls 112.

More explicitly, the two sidewalls 112 of the U-shape installation component 110 further contain a protruding part 116. The purpose of the protruding part 116 is to make the anti-EMI device 100 more tightly connect to the electronic product when being embedded therein. For example, the anti-EMI device can be thus tightly held on the shell of the electronic product. The top edges of the left and right sidewalls of the U-shape installation component 110 further contains a top cover 118 for the top edge of the left and right sidewalls can span over the concave space for accommodating the anti-EMI device 100 inside the electronic product shell.

Figure 2A:
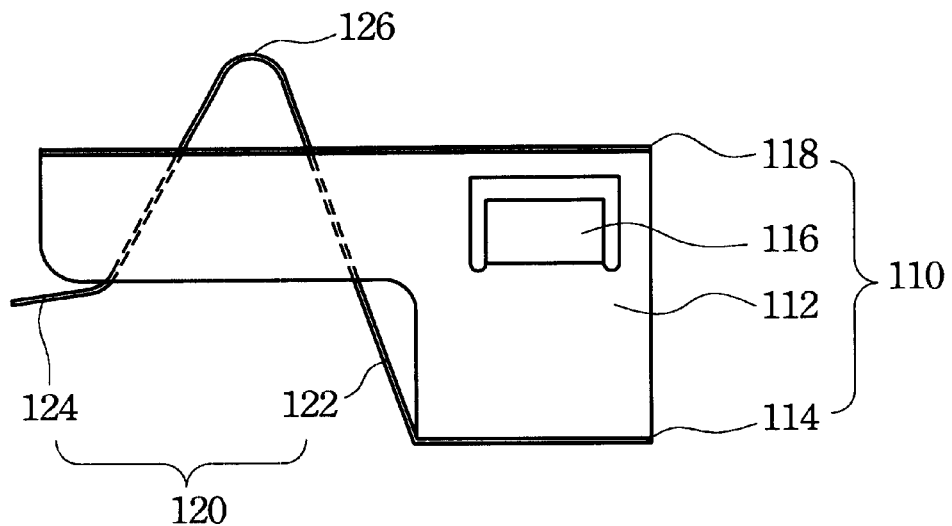
FIG. 2A is a side view of the disclosed anti-EMI device.
Figure 2B:
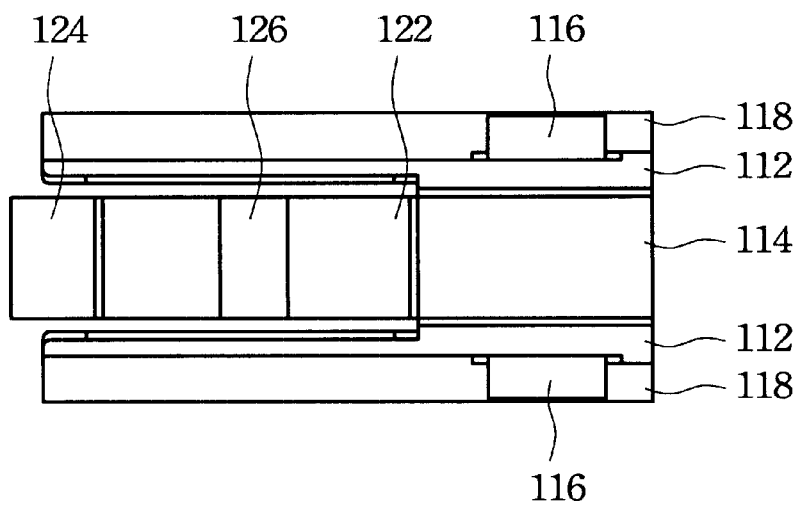
FIG. 2B is a top view of the disclosed anti-EMI device.

With reference to FIG. 2A, a first end 122 of the spring component 120 is connected to the bottom plate 114 of the U-shape installation component. A second end 124 of the spring component 120 further contains a bent part 126, which extends along the two sidewalls 112 of the U-shape installation component 110 toward the opening thereof, protruding from the top edge of the two sidewalls. In other words, the bent part 126 is higher than the height of the top cover 118 so that a tight and elastic connection can be achieved when fixing the disclosed anti-EMI device 100 to the electronic product, effectively shielding the EMI coming from inside of the electronic product. FIG. 2B shows a top view of the disclosed anti-EMI device.

With reference to FIG. 3, the invention can be used on the shell 200 of an electronic product. The shell 200 can be the upper or lower shell of the electronic product. When installing the disclosed anti-EMI device 100 on the shell 200, a concave space has to be formed on the shell 200 to accommodate the anti-EMI device 100. Using the protruding part 116 and the top cover 118 of the U-shape installation component 110, the anti-EMI device 100 can be tightly connected onto the border of the electronic product shell. In addition, the bent part 126 of the spring component 120 is higher than the top cover of the two sidewalls 118, i.e. higher than the border of the shell 200, and the second end 124 of the spring component 120 is a free end to undergo an elastic motion. More particularly, several of the disclosed anti-EMI devices 100 can be embedded into the electronic product shell 200 at an appropriate interval. When the electronic product shell 200 is combined with another shell (not shown), each of the anti-EMI devices 100 can form a tight elastic junction between the upper and lower shells. This configuration can effectively shield EM waves produced inside the electronic product in the gap between the upper and lower shells to meet the EMI safety law requirements, solving the problem caused by the EMI resulted from the gap between the shells.

To summarize, the anti-EMI device disclosed herein can be applied to normal electronic products, such as various types of computers (PC's, laptop computers or servers), among internal components that require tight connections. In particular, the upper and lower shells of a computer can have a firm contact using the elastic spring component of the anti-EMI device, achieving the perfect EMI shielding effect.

With this description of the invention in detail, those skilled in the art will appreciate that modification may be made to the invention without departing from the spirit thereof. Therefore, it is not intended that the scope of the invention is limited to the specific embodiments that have been illustrated and described. Rather, it is intended that the scope to the invention be determined by the scope of the appended claims.

What is claimed is:

1. An anti-EMI device for an electronic product, comprising:
    a U-shape component being embedded in a shell of the electronic product for fixing the anti-EMI device to the electronic product, wherein said U-shape component comprises two sidewalls and a bottom plate connecting said two sidewalls; and
    a spring component located between said two sidewalls, being connected to said bottom plate of the U-shape component, extending along said two sidewalls of the U-shape component toward an opening thereof, and protruding from the electronic product shell for shielding EMI from the electronic product.

2. The device of claim 1, wherein the spring component further comprises a bent part higher than a top edge of the two sidewalls to form a tight elastic connection between upper and lower shells of the electronic product for shielding the EMI.

3. The device of claim 1, wherein each of the sidewalls of the U-shape component further contains a protruding part on its surface for holding the anti-EMI device onto the electronic product shell.

4. The device of claim 1, wherein the U-shape component and the spring component are made of a metal.

5. The device of claim 4, wherein the metal is stainless steel.

6. The device of claim 1, wherein the electronic product is a computer.

7. An anti-EMI device for an electronic product, comprising:
    a U-shape component having a bottom plate and two sidewalls, being embedded in a shell of the electronic product for fixing the auto-EMI device to the electronic product, wherein the top edge of each of the sidewalls of the U-shape component further contains a top cover so that the top edge fits into the electronic product shell; and
    a spring component that is connected to said bottom plate of the U-shape component, extends along the sidewalls of the U-shape components toward an opening thereof, and protrudes from the electronic product shell for shielding EMI from the electronic product.

8. An anti-EMI device installed between shells of an electronic product, comprising:
    an installation component for fixing the anti-EMI device to the electronic product shell, wherein the installation component has a U shape containing two sidewalls and a bottom plate connecting the two sidewalls, the installation component being embedded into the electronic product shell and held onto the shell using the two sidewalls; and
    a spring component for shielding EMI of the electronic product, said spring component being located between said two sidewalls, wherein a first end of the spring component is connected to the bottom plate and a second end of the spring component extends along the two sidewalls toward an opening of the installation component and protrudes from top edges of the two sidewalls.

9. The device of claim 8, wherein the second end of the spring component further contains a bent part higher than the top edges of the two sidewalls for a tight and elastic connection between the shells of the electronic product, thus shielding the EMI from the electronic product.

10. The device of claim 8, wherein each of the sidewalls of the installation component further contains a protruding part for holding the anti-EMI device to the electronic product shell.

11. The device of claim 8, wherein the installation component and the spring component are made of metal.

12. The device of claim 1, wherein the metal is stainless steel.

13. The device of claim 8, wherein the electronic device is a computer.

14. An anti-EMI device installed between shells of an electronic product, comprising:

an installation component for fixing the anti-EMI device to the electronic product shell, wherein the installation component has a U shape containing two sidewalls and a bottom plate connecting the two sidewalls, the installation component being embedded into the electronic product shell and held onto the shell using the two sidewalls; and a spring component for shield of the EMI of the electronic product, said spring component being located between said two sidewalls, wherein a first end of the spring component is connected to the bottom plate and a second end of the spring component extends along the two sidewalls toward an opening of the installation component and protrudes from top edges of the two sidewalls, wherein the top edge of each sidewall of the installation component further contains a top cover for fitting the top edges of the sidewalls into the electronic product shell.

* * * * *